United States Patent
Malik et al.

(10) Patent No.: US 6,246,349 B1
(45) Date of Patent: Jun. 12, 2001

(54) METHOD AND SYSTEM FOR COMPRESSING A STATE TABLE THAT ALLOWS USE OF THE STATE TABLE WITHOUT FULL UNCOMPRESSION

(75) Inventors: Nadeem Malik; Jason Raymond Baumgartner; Steven Leonard Roberts, all of Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/210,091

(22) Filed: Dec. 11, 1998

(51) Int. Cl.[7] .................................................. H03M 7/30
(52) U.S. Cl. ............................................. 341/106; 341/51
(58) Field of Search ............................... 341/106, 67, 87, 341/51

(56) References Cited

U.S. PATENT DOCUMENTS 5,798,721 * 8/1998 Shibata .................................. 341/106
6,100,824 * 8/2000 Macleod ................................ 341/51

* cited by examiner

Primary Examiner—Brian Young
(74) Attorney, Agent, or Firm—Sawyer Law Group LLP; Leslie A. Van Leeuwen

(57) ABSTRACT

A system and method for compressing state transition data on a computer system is disclosed. The method and system include separating the state transition data into a plurality of segments and separating each of the plurality of segments into a plurality of subsegments. The method and system further include providing a plurality of code words. Each of the plurality of code words corresponds to a unique subsegment of the plurality of unique subsegments. The method and system also include providing a representation of each segment. The representation of each segment includes a portion of the plurality of code words. The portion of the plurality of code words replaces the plurality of subsegments in each of the plurality of segments. Thus, the present invention allows compressed state transition data to be used without full uncompression, allowing a system to be explicitly checked without substantial loss of information and without consuming memory.

19 Claims, 5 Drawing Sheets

METHOD AND SYSTEM FOR COMPRESSING A STATE TABLE THAT ALLOWS USE OF THE STATE TABLE WITHOUT FULL UNCOMPRESSION

CROSS-REFERENCE TO RELATED APPLICATIONS

The present invention is related to co-pending U.S. patent application entitled "METHOD AND SYSTEM FOR COMRPESSING DATA WHICH ALLOWS ACCESS TO DATA WITHOUT FULL UNCOMPRESSION", Ser. No. 09/210,503 filed Dec. 11, 1998 and assigned to the assignee of the present application.

FIELD OF THE INVENTION

The present invention relates to computer systems and more particularly to a method and system for compressing state transition data which provides the ability to use the compressed state transition data without completely decompressing the compressed state transition data.

BACKGROUND OF THE INVENTION

Model checking provides a mechanism for evaluating digital logic and protocols. Model checking determines the states that a system may reach from different sets of inputs. The model can determine whether the states that the system can reach violate a condition, such as a design parameter. Typically, the states are checked using either implicit or explicit checking. Implicit checking allows a large number of states to be checked, but is time consuming. Consequently, explicit checking may be used.

Explicit checking is relatively fast. Explicit checking explicitly determines the valid states that a system being tested can reach. In order to determine the states a system under test can reach, state transition data is generated. State transition data is usually in the form of a state transition table. A state transition table is a table of state transitions. A state transition is an ordered pair of states, (S1, S2), where state S2 succeeds state S1 in the design/protocol under test. The state transition table may also be used to generate a state transition graph. The entries of the table can be evaluated to determine if the state violates a condition or design parameter. Similarly, a state transition graph can be used to plot the data in the state transition table. Thus, using the entries of the state transition table or using the state transition graph, it can be determined whether the system operates as designed.

For example, two types of conditions may be checked using explicit model checking: safety properties and liveness properties. Safety properties are of the form "it is/is not possible for the system to enter state X," or "if X is true, then Y must be true Z cycles later." Thus, safety properties are always true or bounded in time. Liveness properties are not bounded in time. An example of a liveness property is "if X is true, Y must eventually be true." When all the states have been generated in a state transition table, a safety property may be checked by determining whether the safety property is true in any of the states generated. A liveness property may be checked using a state transition graph and determining the connection between particular states (nodes in the state transition graph) and the possible transitions to states which can be reached from the particular states.

Model checking rapidly consumes memory. The entries in the state transition table or nodes in the state transition graph should be capable of being accessed randomly to allow a user to adequately evaluate the system being checked. However, typical logic systems have an extremely large number of possible states. A system may be represented by n bits. The possible states that can be reached by that system are on the order of $2^n$. For example, a processor may be represented by a thousand bits. Consequently, the number of reachable states for such a processor is extremely large. Each of these possible states is stored in memory. Memory is, therefore, rapidly consumed by explicit model checking. Typically, the number of possible states is large enough to be incapable of being stored in memory for use.

To reduce the number of states that are generated, explicit model checking typically generates only valid states. Furthermore, explicit model checking is used for systems that can be represented by a smaller number of bits. However, memory is still rapidly consumed. For example, a system may be represented by only one hundred bits. Furthermore, only half of the possible states may be valid. However, $2^{99}$ is still a large number of states. Thus, memory may still be rapidly consumed. As a result, the state transition data may still not be able to be accessed randomly to allow the system to be checked.

Conventional data compression would allow the state transition data to be stored using a smaller amount of memory. As the state transition data is read, unique patterns of bits are searched for and a dictionary generated. The dictionary associates a unique pattern of bits with a code word. If the current bits being read do not match a pattern, then the bits are resaved in the order of the source data file. However, if a pattern recurs, then a code word replaces the pattern. Typically, the code word may point to a previous occurrence of the pattern. However, the code word could also point to the entry in the dictionary corresponding to the code word. Thus, a conventional compressed state transition file is generated.

However, conventional data compression allows the conventional compressed state transition file to occupy less memory than the state transition data only while the conventional compressed state transition data is stored. The different states stored in the state transition data, or the entries of the state transition table, must be able to be accessed randomly. Using conventional data compression, random access of portions of the compressed data is not possible without uncompressing the entire conventional file. The uncompressed state transition file occupies the same amount of space as the state transition data. Thus, conventional data compression may not allow the state transition data to be used without exhausting memory.

In order to allow explicit model checking to be used, lossy checking schemes have been developed. Lossy checking schemes typically utilize only a portion of the states that may be generated. Thus, because the schemes are lossy, only a portion of the possible states is checked. For example, one popular scheme is known as the Murphi scheme. The Murphi scheme is described more fully in "New Scheme for Memory-Efficient Probabilistic Verification" by David Dill and Stem in IFIP Conference on Formal Description Techniques for Distributed Systems and Communications Protocol (1996). The Murphi scheme uses a hash table to represent the states that are generated. In the Murphi scheme, two unique states generated may be hashed to the same value and, therefore, treated as the same state. In other words, this scheme maps similar states to a single state. Only the states to which similar states have been mapped are explicitly checked. Thus, only a portion of the possible states is checked and only a portion of the possible transition data is saved.

Although lossy checking schemes allow systems to be checked, one of ordinary skill in the art will readily realize that important information may be lost. Checking only the states to which a number of similar states are mapped may allow a developer to check some severe conditions. However, other fault conditions may be missed because some information is lost. Thus, lossy checking schemes may result in false positives, which incorrectly indicate that a system is operating properly because of information lost due to the checking scheme chosen. For similar reasons, lossy checking schemes may also result in false negatives, which incorrectly indicate that the system is not operating properly. Consequently, lossy checking schemes may not adequately check a system of interest. Moreover, a lossy checking scheme such as the Murphi scheme does not compute the state transition graph or save each state generated. Instead, some information relating to the transitions between states is stored. When a state transition graph is to be generated, this data must be used to generate the state transition graph. This results in a larger file size, which consumes more memory, and input/output limitations. In addition, if a user wishes to check the states taken to reach a state that violated a condition, the states are regenerated. This is because lossy checking schemes typically do not include information relating to the transitions between states. Recalculation of the path taken to a state which violates a condition requires additional time and computing resources.

Accordingly, what is needed is a system and method for providing allowing explicit model checking to be performed without losses and without rapidly consuming memory. The present invention addresses such a need.

SUMMARY OF THE INVENTION

The present invention provides a method and system for compressing state transition data on a computer system. The method and system comprise separating the state transition data into a plurality of segments and separating each of the plurality of segments into a plurality of subsegments. The method and system further comprise providing a plurality of code words. Each of the plurality of code words corresponds to a unique subsegment of the plurality of unique subsegments. The method and system also comprise providing a representation of each segment. The representation of each segment includes a portion of the plurality of code words. The portion of the plurality of code words replaces the plurality of subsegments in each of the plurality of segments.

According to the system and method disclosed herein, the present invention allows the compressed state transition data to be used without full uncompression, thereby allowing a system to be explicitly checked without substantial loss of information and without consuming memory.

DETAILED DESCRIPTION OF THE INVENTION

The present invention relates to an improvement in data compression. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
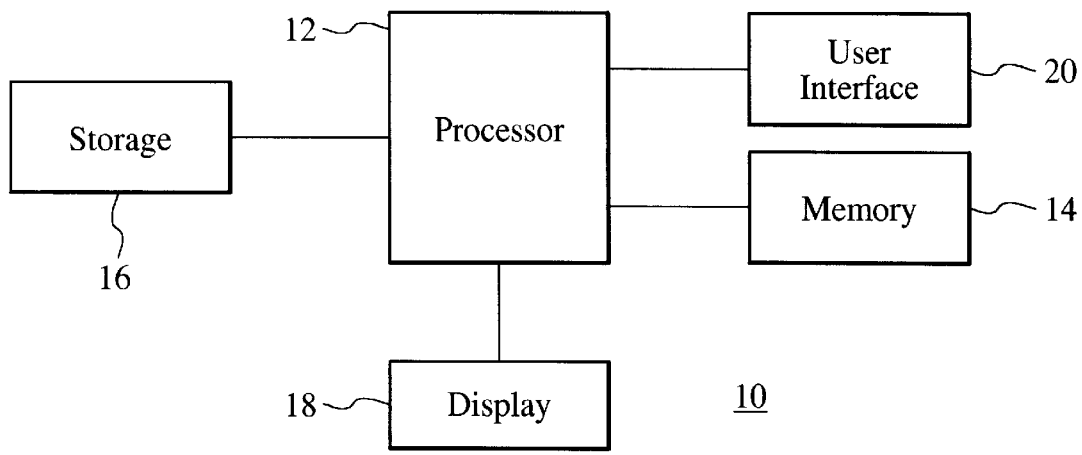
FIG. 1 is a block diagram of a computer system.

FIG. 1 is a block diagram of one computer system 10 with which the present invention could be used. The computer includes a processor 12, memory 14, storage 16, a display 18, and a user interface 20. The storage 14 may include a variety of devices, such as a hard disk or a removable storage medium including a floppy disk or tape. The user interface 20 typically includes a mouse, a keyboard or other devices (not shown). Although the computer system 10 is depicted, another computer system could be very different. For example, the computer system could be connected to a private or public network, could include other or different components, or be used in a variety of applications, such as those discussed above. The processor 12 is used to run applications (not shown) which may use the memory 14. However, for long term storage, data is typically stored on the storage 16.

One application run on the processor 12 could be used for explicit model checking. Typically explicit model checking is used to test logic systems. However, nothing prevents the use of a model checker with other systems. The application performing explicit model checking may generate state transition data. State transition data includes the states a system of interest may reach from a set of inputs. Typically, state transition data would take the form of a state transition table or a state transition graph. The number of possible states for a system being checked may be extremely large. For example, a processor being represented by n bits typically has $2^n$ states available. The number n is typically large. For example, n may be one thousand. Even if only valid states are checked and the number of possible states is relatively small, the state transition data may rapidly consume the memory 14.

The present invention provides a method and system for compressing state transition data on a computer system. The method and system comprise separating the state transition data into a plurality of segments and separating each of the plurality of segments into a plurality of subsegments. The method and system further comprise providing a plurality of code words. Each of the plurality of code words corresponds to a unique subsegment of the plurality of unique subsegments. The method and system also comprise providing a representation of each segment. The representation of each segment includes a portion of the plurality of code words. The portion of the plurality of code words replaces the plurality of subsegments in each of the plurality of segments.

Because the state transition data is compressed, memory is not consumed while the compressed state transition data is stored. This compressed data may be randomly accessed. Thus, even when the compressed data is used, memory may not be consumed. Furthermore, the compression is not lossy. As a result, important information may not be lost. Consequently, the state transition data more accurately reflects the actual states reached. Therefore, the model checking performed using the state transition data is more likely to be correct.

The present invention will be described in terms of a particular computer system and particular applications. However, one of ordinary skill in the art will readily recognize that this method and system will operate effectively for other types of computer systems and other applications. Moreover, the present invention will be discussed in the context of segments, subsegments, and data having particular lengths. However, one of ordinary skill in the art will readily realize that the present invention is consistent with segments, subsegments, and data having different lengths. Furthermore, data compression in accordance with the present invention is also described in co-pending U.S. patent application entitled "METHOD AND SYSTEM FOR COMRPESSING DATA WHICH ALLOWS ACCESS TO DATA WITHOUT FULL UNCOMPRESSION" filed on Dec. 11, 1998 and assigned to the assignee of the present application. Applicant hereby incorporates by reference the above-mentioned co-pending application.

Figure 2:
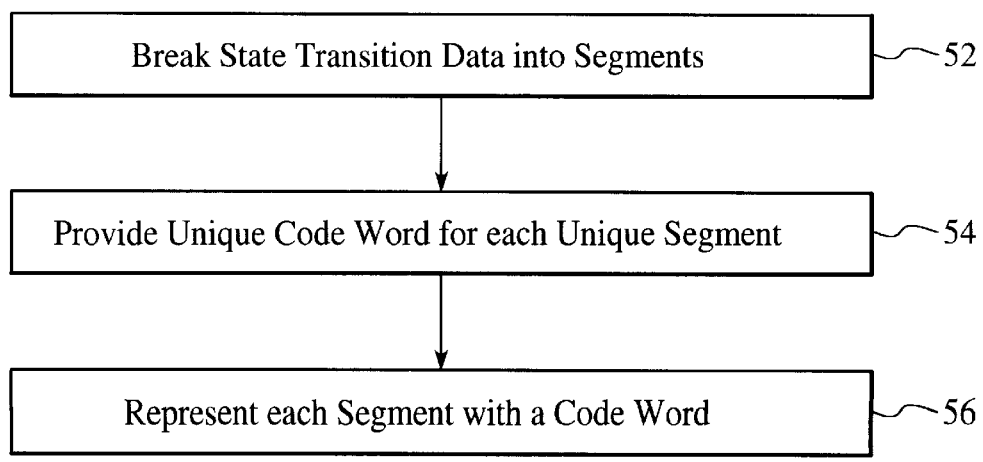
FIG. 2 is a high-level flow chart depicting a method in accordance with the present invention for compressing state transition data.

To more particularly illustrate the method and system in accordance with the present invention, refer now to FIG. 2 depicting a high level flow chart of one embodiment of a method 50 in accordance with the present invention. The method 50 may be used in conjunction with a computer system, such as the computer system 10. The method 50 compresses a portion of the state transition data. The state transition data is preferably explicitly generated without losses. Thus, all states or all valid states may be generated. The state transition is broken into segments, via step 52. In a preferred embodiment, each segment has the same length. A unique code word is then generated for each unique segment of the segments, via step 54. As more code words are generated, the length of each code word may increase when all combinations for a particular length code word have been used. In a preferred embodiment, the length of each code word is increased by a small integral number of bits, for example four bits, each time longer code words become needed. Also in a preferred embodiment, step 54 includes generating a dictionary indicating the correspondence between each unique code word and the unique segment it represents. A representation for each of the segments is then provided, via step 56. In a preferred embodiment, step 56 includes generating a compressed file by providing a code word corresponding to each of the segments. In a preferred embodiment, the code words are provided in the order of the segments. Thus, the first segment is represented in the compressed file by a first code word. The second segment is represented in the compressed file by a second code word. However, if the second segment is the same as the first segment, then the second code word and the first code word are the same.

The method 50 can be applied hierarchically. Thus, the portion of the state transition data compressed in the method 50 may be an entire file, or a portion of the entire file. For example, the data set could be one of a number of super-segments. The super-segments could make up the entire state transition data or a portion of the state transition data. To use the method 50 hierarchically, step 52 may be repeated until the lowest level in the hierarchy is reached. Steps 54 through 56 may be performed for the lowest level of the hierarchy having the shortest segment length. Segments in higher levels of the hierarchy can be represented by code words based on the pattern code words from the next lower level in each segment. Because the method 50 can be performed hierarchically and because there is a greater probability of similarity between bits of smaller widths of a segment, the size of the dictionary may be kept small.

Figure 3:
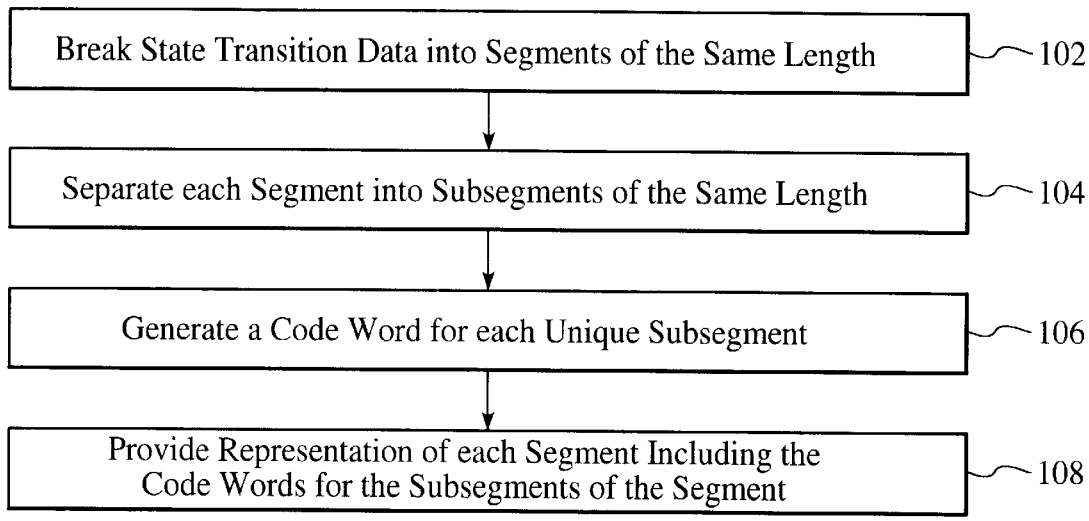
FIG. 3 is a more detailed flow chart of a method in accordance with the present invention for compressing state transition data.

FIG. 3 depicts a more detailed flow chart of one embodiment of a method 100 in accordance with the present invention. The method 100 may be used in conjunction with a computer system, such as the computer system 10, which is performing model checking. The method 100 is preferably compresses state transition data generated by an explicit model checker (not shown) which generates all possible states or all valid states for a system of interest. In one embodiment, the method 100 is implemented as the explicit model checker (not shown) generates the states for a system of interest. Thus, the method 100 may be used on the state transition data as the state transition data is generated.

The method 100 compresses at least a portion of the state transition data. The portion of the state transition data is broken into segments, via step 102. In a preferred embodiment, each segment has the same length. Also in a preferred embodiment, the segments are adjacent. Each segment is separated into subsegments, via step 104. In a preferred embodiment, the subsegments are adjacent and have the same length. A code word is generated for each unique subsegment, via step 106. In a preferred embodiment, step 106 includes generating a dictionary indicating the correspondence between each unique code word and the unique segment it represents. As more code words are generated, the length of each code word may increase when all combinations for a particular length code word have been used. In a preferred embodiment, the length of all code words is increased by a small integral number of bits each time longer code words become needed.

A representation of each segment is provided, via step 108. In a preferred embodiment, the representations for the segments are stored in a file in the order in which the segments appeared. In one embodiment, the representation of each segment includes the code words for each subsegment in the segment. In a preferred embodiment, the representation of each segment includes the code word for each of the subsegments in the order each subsegment appeared. Like the method 50, the method 100 can be applied hierarchically. Thus, the state transition data compressed in the method 100 may be an entire file, or a portion of the entire file.

Figure 4:
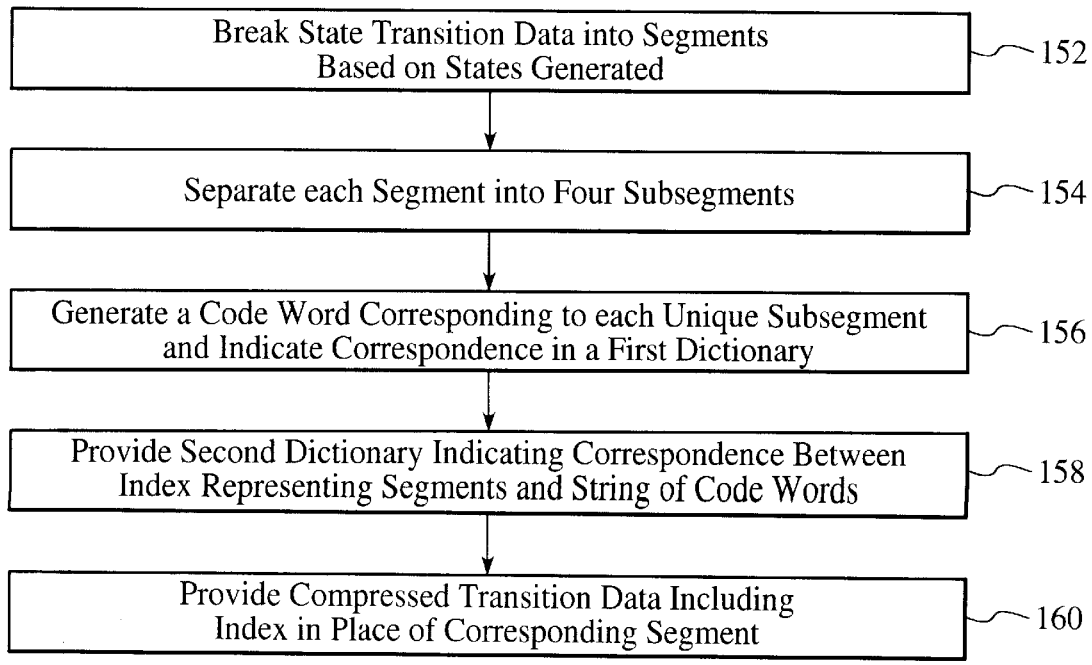
FIG. 4 is a more detailed flow chart of a preferred embodiment of a method in accordance with the present invention for compressing state transition data.

FIG. 4 depicts a more detailed flow chart of a preferred embodiment of a method 150 for compressing state transition data in accordance with the present invention. The method 150 compresses state transition data using a two level hierarchy. The method 150 may also be used in conjunction with a computer system, such as the computer system 10, which is performing model checking. In one embodiment, the method 150 compresses state transition data provided by an explicit model checker (not shown) as it generates all possible or all valid states for a system of interest. In one embodiment, the method 150 operates as the explicit model checker generates the states for the system of interest. Thus, the method 150 may be used on the state transition data as the state transition data is generated.

State transition data set is broken into segments based on the states generated, via step 152. Thus, each segment includes the bits representing a particular state that was generated. Each segment is separated into four subsegments, via step 154. Thus, each subsegment formed in step 154 includes one-fourth of the bits representing a state. A code word is generated for each unique subsegment, via step 156. In a preferred embodiment, step 156 includes generating a first dictionary indicating the correspondence between each unique code word and the unique segment it represents. As more code words are generated, the length of each code word may increase when all combinations for a particular length code word have been used. In a preferred embodiment, the length of all code words is increased by a small integral number of bits each time longer code words become needed.

Each segment (state) is then represented by the code words corresponding to the subsegments within the segment, via step 158. In a preferred embodiment, step 158 includes generating a second dictionary. In an alternate embodiment, step 158 could include providing an index for each unique subsegment. In this embodiment, the second dictionary provided in step 158 indicates the correspondence between the index for each unique segment and the code words representing the subsegments within the unique segment. In another embodiment, step 158 includes providing each segment with a corresponding index. In this embodiment, the second dictionary provided in step 158 indicates the correspondence between the index for the segment and the code words representing the subsegments within the segment.

The compressed transition data is provided, via step 160. The index for a segment replaces the segment in the compressed transition data. Thus, an index in the compressed state transition data replaces each state in the state transition data. In one embodiment, where the index corresponds to a unique segment or state, the number of indices may be less than the number of states generated. In a preferred embodiment, the indices for the segments are stored in the order in which the segments appeared.

Figure 5:
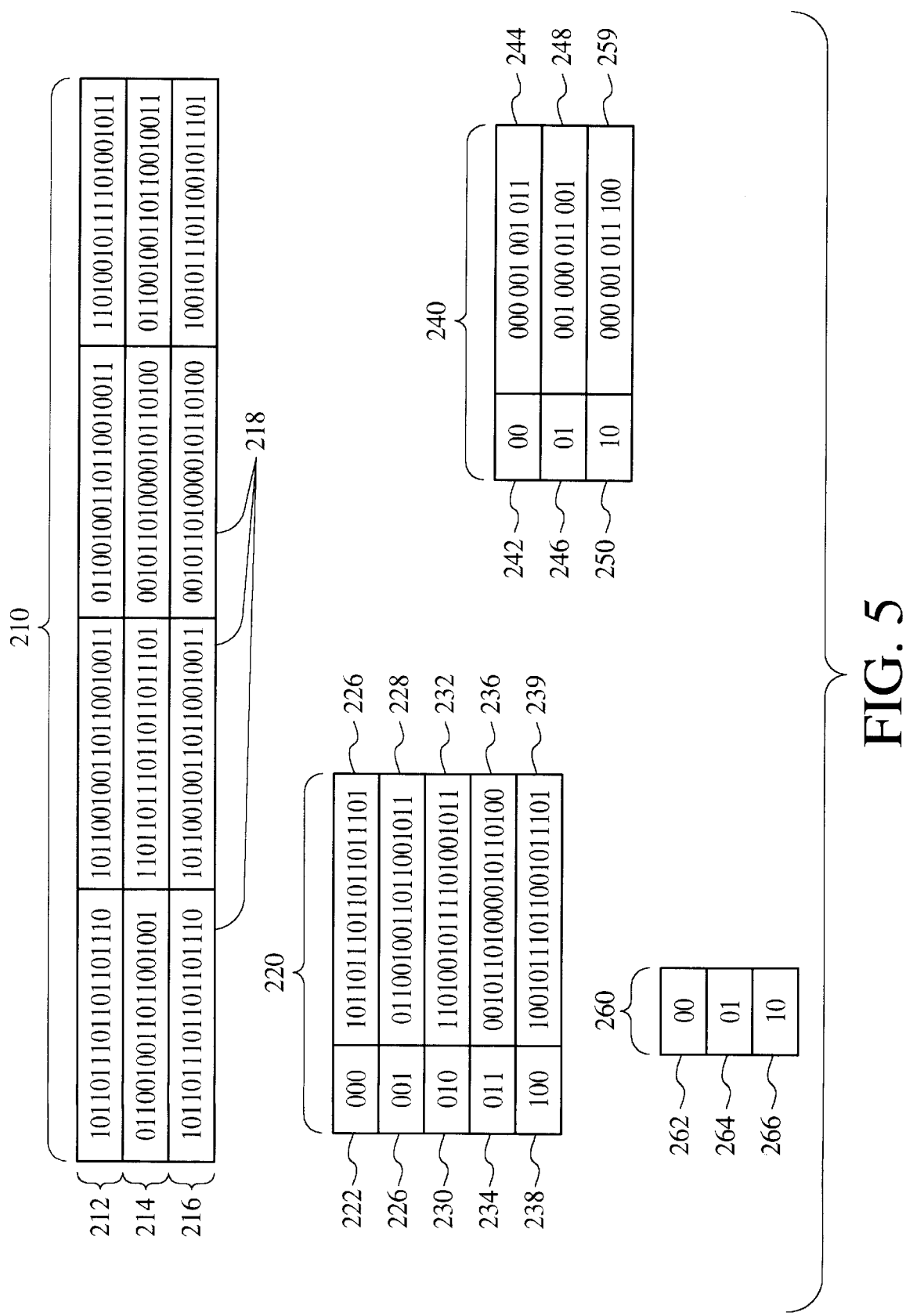
FIG. 5 is a diagram depicting a correspondence between state transition data, compressed state transition data in accordance with the present invention, and a dictionary in accordance with the present invention.

To more particularly explain the method 150, refer to FIG. 5. FIG. 5 depicts state transition data 210, a first dictionary 220, a second dictionary 240, and compressed transition data 260 of particular lengths and having segments and subsegments of particular lengths. However, the present invention is consistent with other lengths and other numbers of segments or subsegments. Furthermore, the present invention is consistent with other levels of hierarchy and dividing the state transition data 210 along different lines.

There are two levels in the hierarchy for the state transition data 210, the first dictionary 220, the second dictionary, and compressed state transition data 260 shown in FIG. 5. The state transition data 210 has three states 212, 214, and 216. Each state 212, 214, or 216 is a segment 212, 214, or 216. Each segment 212, 214, and 216 includes four subsegments 218. Each subsegment is twenty bits long. The use of subsegments, which are shorter than the segments, makes it more likely that a pattern found in one of the subsegments 218 will be found in another of the subsegments 218.

The first dictionary 220 indicates the relationship between the unique code words 222, 226, 230, 234, and 238 and the corresponding unique subsegment 224, 228, 232, 236, and 239 respectively. The first dictionary 220 is, therefore, a dynamically growable hash table. The hash table grows as subsegments 18 having new patterns are read. The hash indices of the first dictionary 220 are the code words 222, 226, 230, 234, and 238. As depicted in FIG. 5, although the state transition data 210 includes two hundred and forty bits, there are only five unique subsegments 218. Therefore, only five code words 222, 226, 230, 234, and 238 are used. The first dictionary 220 includes code words 222, 226, 230, 234, and 238 each having the same length, three bits. Each code word 222, 226, 230, 234, and 238 represents a unique subsegment 224, 228, 232, 236, or 239, respectively that are all ten bits in length.

The second dictionary 240 includes the indices 242, 246, and 250 and the corresponding string of code words 244, 248, 252. Each index 242, 246, and 250 could correspond to a segment or a unique segment. If an index 242, 246, and 250 represents a unique segment, then the index 242, 246, and 250 could occur twice in the compressed state transition data 260. The string of code words 244, 248, and 252 are the code words 224, 228, 232, 236, and 239 which replace the subsegments 218.

In a preferred embodiment, the first dictionary 220 and second dictionary 240 are stored in the memory 14 of the system 10 depicted in FIG. 1. However, if the first dictionary 220 or second dictionary 220 are large in size, the dictionaries 220 or 240 may be stored elsewhere. For example, the first dictionary 220 or the second dictionary 240 may reside on the storage 16. However, the code words 222, 226, 230, and 230 and the unique subsegments 224, 228, 232, and 236 may be accessed randomly because the first and second dictionaries 220 and 240, respectively, are ordered by the code words (hash index) 222, 226, 228, and 230 and the hash index 242, 246, and 250.

The compressed state transition data 260 includes an index in place of each segment 212, 214, and 216. The bits are the indices for each segment 212, 214, and 216. As depicted in FIG. 5, the bits represent the numbers zero through three, indicating the code words 222, 226, 230, and 324. Thus, using the terminology of a hash table, the hash index stored in the compressed state transition data 260 replaces the actual data. The index stored is generally $\log_2(m)$ bits wide, where m is the number of unique states Note that if the method 50 or 150 are utilized, then the compressed state transition data 260 might include the strings of code words 244, 248, and 252 and the second dictionary 240 may not be generated.

For ease of understanding, the compressed file 260 is shown as having three sections 262, 264, and 266 corresponding to the segments 212, 214, and 216 of the state transition 210. Each section includes the base two representation of the indices 242, 246, and 250. Three indices are used to represent the state transition data 210 and each code word is two bits long. Thus, the compressed state transition data is only six bits in length, while the source data file is two hundred and forty bits long. In addition, the compressed state transition data 260, the first dictionary 220, and the second dictionary 240 include a total of one hundred and sixty-three bits, while the state transition data includes two hundred and forty bits.

In another example, not shown, including four hundred and eighty bits for each state, two orders of magnitude of compression were achieved where three million reachable states were possible. Higher orders of magnitude compression may be achieved for a larger number of possible states.

Thus, state transition data can be compressed via the method 50, 00, or 150 into compressed state transition data 260 which includes a string of code words or an index for each segment in the state transition data. The compressed file 260 occupies a much smaller portion of space in the memory 14 or the storage 16 than the state transition data 210. When the compressed state transition data 260 is used, only a portion of the compressed data that is of interest need be uncompressed. The methods 50, 100, and 150 are not lossy. No information is lost during compression. As a result, each of the states generated can be checked. Therefore, the probability of false positives or false negatives due to lossy checking schemes is reduced or eliminated. Furthermore, any information relating to transition between states provided by the model checker which generates the states is compressed by the methods 50, 100, or 150. Consequently, such information is not lost upon compression. Therefore, generation of a state transition graph (not shown) or providing a path of the states taken to reach a particular state is facilitated.

Figure 6:
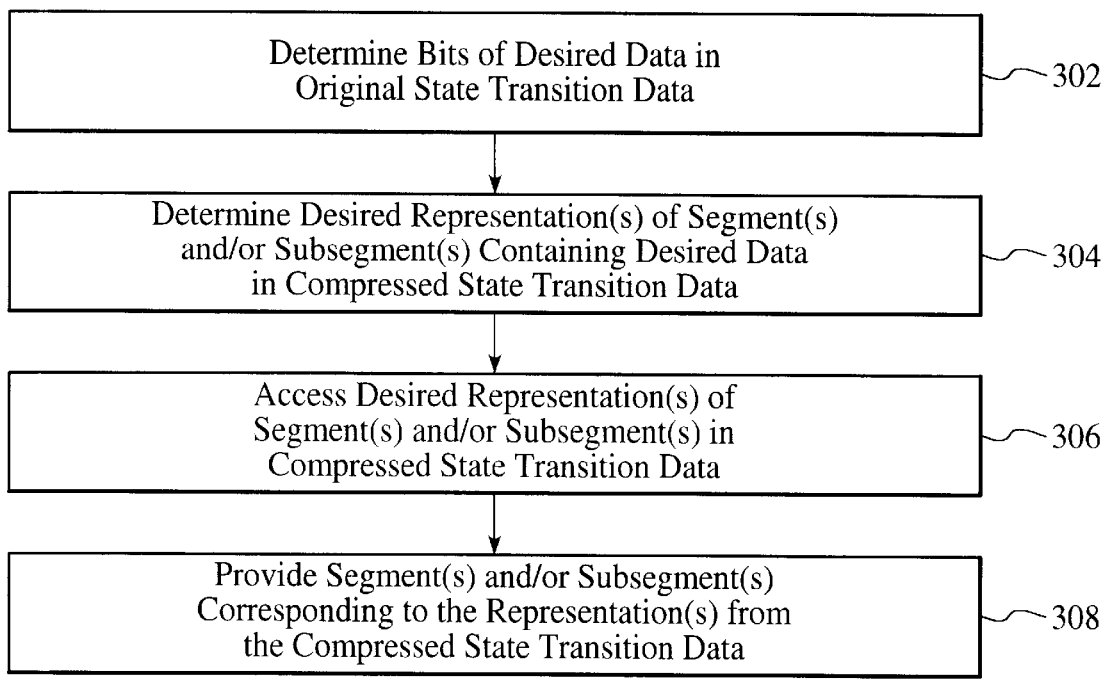
FIG. 6 is a flow chart depicting a method for using state transition data compressed in accordance with the present invention.

To more particularly illustrate the use of a compressed file 260, refer to FIG. 6. FIG. 6 depicts a method 300 for using a portion of compressed file 260. The bits in the state transition data 210 which are the desired data are determined, via step 302. The portion(s) of the compressed state transition data 260 including the index (or indices) and code word(s) corresponding to the desired data are then determined, via step 304. Step 304 is relatively simple to perform because a particular number of bits in the state transition data 210 correspond to a certain number of bits in the compressed state transition 260. For example, the first eighty bits (the segment 212) correspond to the index in the first section 262 and, therefore, to the string of code words 244.

The appropriate section(s) 262, 264, or 266 of the compressed state transition data 260 are then accessed, via step 306. Thus, the index or indices in the compressed state transition data 260 corresponding to the desired data are accessed in step 306. The corresponding unique subsegments 224, 228, 232, 236, or 239 corresponding to the indices are then provided, via step 308.

Figure 7:
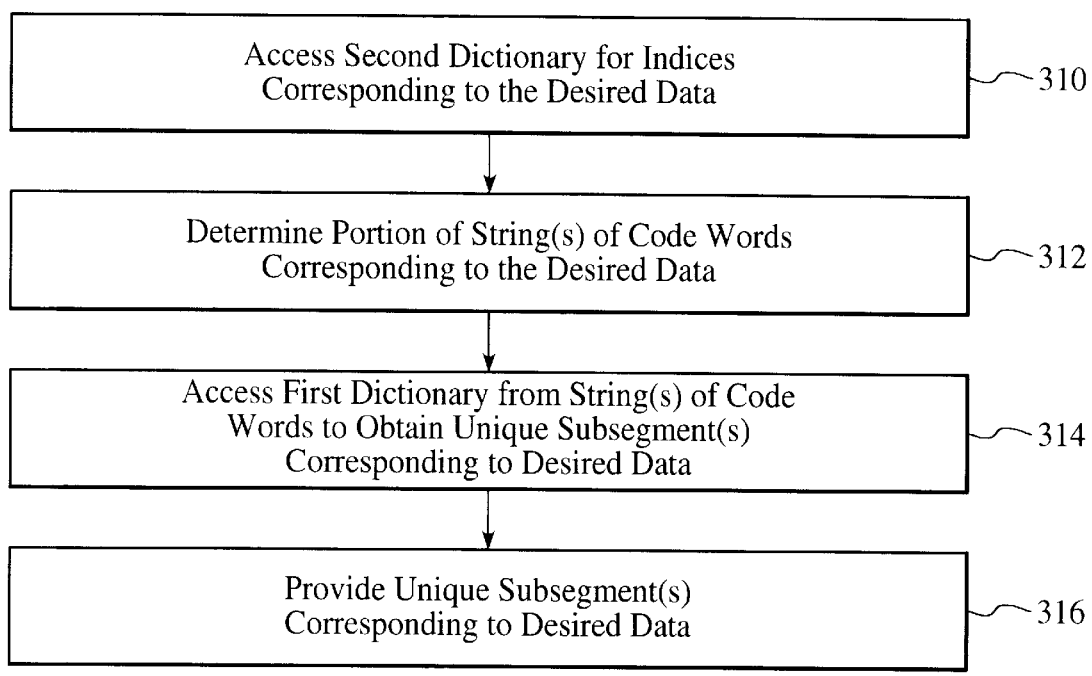
FIG. 7 is a flow chart depicting a method for providing the desired data from the compressed state transition data.

FIG. 7 depicts one embodiment of step 308, obtaining the subsegments 224, 228, 232, 236, or 239 containing the desired data. The second dictionary 240 is accessed for the index or indices 242, 246, or 250 corresponding to the desired data, via step 310. From the index 242, 246, or 250 the portion of the string(s) of code words 244, 248, and 252 corresponding to the desired data are accessed, via step 312. In one embodiment, any one of the four code words in each of the strings 244, 248, or 252 can be accessed in step 312. The first dictionary 220 is accessed to obtain unique subsegment(s) 224, 228, 232, 236, or 239 for each code word in the portion of the string(s) of code words, via step 314. The unique subsegment(s) 228, 232, 236, or 239 from the portions of the string(s) of code words are then returned, via step 316.

For example, suppose bits forty through fifty-nine of the state transition data 210 are determined to be of interest in step 302. Thus, the third subsegment 218 of the first segment 212 is of interest. Each section 262, 264, and 266 corresponds to eighty bits in the state transition data 210. The section 262 corresponds to the first segment 212 and, therefore, includes the third subsegment 218. Thus, the first section 262 is accessed in step 306. The second dictionary 240 is then accessed in step 310 based on the hash stored in the first section 262. It is then determined that the string of code words 244 includes the desired data, in step 312. In one embodiment, it can be determined that the third code word, the seventh through ninth bits in the string of code words 244, includes the desired data. The first dictionary 220 is then accessed, in step 310. Where the individual code word can be determined, then the code word 226 is accessed in step 310. Otherwise, each of the code words in the string 244 may be accessed. In step 316 the unique subsegment 228 is provided if the third code word in the string 244 was accessed. Otherwise, the unique subsegments 224, 228, and 232 may be provided.

Thus, data in the compressed state transition data 260 can be accessed in non-sequential order. Because of this, the entire compressed state transition data 260 need not be uncompressed in order for an application to use a portion of the compressed state transition data 260. Instead, a portion of the compressed state transition data 260 may be uncompressed at a particular time. Thus, the memory 14 is not needlessly consumed. As a result, the states generated can be accessed randomly.

Furthermore, the state transition data can be provided without losses. The methods 50, 100, and 150 compress data without losing information. As a result, each of the states generated can be checked. Therefore, the probability of false positives or false negatives due to lossy checking schemes is reduced or eliminated. Because the state transition data can be compressed and accessed randomly, the problems of conventional data compression or lossy checking schemes may be avoided. Any information relating to transitions between states provided by the model checker which generates the states is compressed by the methods 50, 100, or 150. Consequently, such information is not lost upon compression. Therefore, generation of a state transition graph (not shown) or providing a path of the states taken to reach a particular state is facilitated.

Thus, the present invention provides a method and system for compressing state transition data. Therefore, the state transition data can be generated without losses. Furthermore, the compressed state transition data can be randomly accessed without full uncompression. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for compressing state transition data on a computer system, the method comprising the steps of:

(a) separating the state transition data into a plurality of segments;

(b) separating each of the plurality of segments into a plurality of subsegments;

(c) providing a plurality of code words, each of the plurality of code words corresponding to a unique subsegment of the plurality of unique subsegments;

(d) providing a representation of each segment, the representation of each segment including a portion of the plurality of code words;

wherein the portion of the plurality of code words replaces the plurality of subsegments in each of the plurality of segments.

2. The method of claim 1 wherein the plurality of code words providing step further includes the step of:

(b1) providing a first dictionary indicating a correspondence between the plurality of code words and the plurality of unique subsegments.

3. The method of claim 2 wherein the representation providing step (d) further includes the step of:

(d1) providing a second dictionary including a plurality of indices corresponding to the plurality of segments;

wherein each of the plurality of indices correspond to the portion of the plurality of code words for the corresponding segment, and wherein the method further includes the step of (e) providing a compressed state transition data file including the plurality of indices, wherein each of the plurality of indices replaces the corresponding segment.

4. The method of claim 2 wherein the plurality of segments further include a plurality of unique segments and wherein representation providing step (d) further includes the step of:

(d1) providing a second dictionary including a plurality of indices corresponding to the plurality of unique segments;

wherein each of the plurality of indices correspond to the portion of the plurality of code words for the corresponding unique segment, and wherein the method further includes the step of (e) providing a compressed state transition data file including the plurality of indices, wherein each of the plurality of indices replaces the corresponding segment.

5. The method of claim 1 wherein the representation providing step (d) further include the step of:

(d1) providing compressed state transition data including the representation of each of the subsegments.

6. The method of claim 1 wherein a portion of the state transition data corresponding to a portion of the compressed state transition data may be accessed without uncompressing all of the compressed state transition data.

7. The method of claim 1 wherein the state transition data includes a state transition table having a plurality of rows and wherein the compressed state transition data further includes a compressed state transition table.

8. The method of claim 7 wherein the plurality of rows corresponds to a plurality of states.

9. The method of claim 1 wherein the code word representing a particular subsegment of the plurality of subsegments can be randomly accessed.

10. A computer system for compressing state transition data, the system comprising:

a processor;

a memory coupled with the processor;

a storage coupled with the processor; and means coupled with the processor for compressing the state transition data, the compressing means further including means for separating the state transition data into a plurality of segments;

means for separating each of the plurality of segments into a plurality of subsegments;

means for providing a plurality of code words, each of the plurality of code words corresponding to a unique subsegment of the plurality of unique subsegments; and means for providing a representation of each segment, the representation of each segment including a portion of the plurality of code words;

wherein the portion of the plurality of code words replaces the plurality of subsegments in each of the plurality of segments.

11. The system of claim 10 wherein the providing plurality of code words providing means further includes:

means for providing a first dictionary indicating a correspondence between the plurality of code words and the plurality of unique subsegments.

12. The system of claim 11 wherein the representation providing means further includes:

means for providing a second dictionary including a plurality of indices corresponding to the plurality of segments;

wherein each of the plurality of indices correspond to the portion of the plurality of code words for the corresponding segment, and wherein the system further includes means for providing a compressed state transition data file including the plurality of indices, wherein each of the plurality of indices replaces the corresponding segment.

13. The system of claim 11 wherein the plurality of segments further include a plurality of unique segments and wherein representation providing means further includes:

means for providing a second dictionary including a plurality of indices corresponding to the plurality of unique segments;

wherein each of the plurality of indices correspond to the portion of the plurality of code words for the corresponding unique segment, and wherein system further includes means for providing a compressed state transition data file including the plurality of indices, wherein each of the plurality of indices replaces the corresponding segment.

14. The system of claim 10 wherein the representation providing means further includes:

means for providing compressed state transition data including the representation of each of the subsegments.

15. The system of claim 10 wherein a portion of the state transition data corresponding to a portion of the compressed state transition data may be accessed without uncompressing all of the compressed state transition data.

16. The system of claim 10 wherein the state transition data includes a state transition table having a plurality of rows and wherein the compressed state transition data further includes a compressed state transition table.

17. The system of claim 16 wherein the plurality of rows corresponds to a plurality of states.

18. The system of claim 10 wherein the code word representing a particular subsegment of the plurality of subsegments can be randomly accessed.

19. A computer-readable medium having a program for compressing state transition data on a computer system, the program including instructions for:

(a) separating the state transition data into a plurality of segments;

(b) separating each of the plurality of segments into a plurality of subsegments;

(c) providing a plurality of code words, each of the plurality of code words corresponding to a unique subsegment of the plurality of unique subsegments;

(d) providing a representation of each segment, the representation of each segment including a portion of the plurality of code words;

wherein the portion of the plurality of code words replaces the plurality of subsegments in each of the plurality of segments.

* * * * *